US006423154B1

United States Patent
Van Gerven et al.

(10) Patent No.: US 6,423,154 B1
(45) Date of Patent: Jul. 23, 2002

(54) SOLDER-COATING METHOD, AND SOLDER PASTE SUITABLE FOR USE THEREIN

(75) Inventors: Johannes A. H. Van Gerven; Michael T. W. De Langen, both of Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 08/586,443

(22) Filed: Jan. 11, 1996

Related U.S. Application Data

(62) Division of application No. 08/331,823, filed on Oct. 31, 1994, now Pat. No. 5,551,628.

(30) Foreign Application Priority Data

Nov. 2, 1993 (EP) ............................................. 93203059

(51) Int. Cl.[7] ......................... B23K 35/22; B23K 31/02; H01L 23/48; C22C 13/00
(52) U.S. Cl. ..................... 148/24; 228/248.1; 257/736; 257/779; 420/558
(58) Field of Search .......................... 228/248.1, 248.5; 420/557, 558, 565, 570; 257/734, 772, 779, 736; 148/24

(56) References Cited

U.S. PATENT DOCUMENTS

| 4,872,261 A | * | 10/1989 | Sanyal et al. |
| 5,001,829 A | * | 3/1991 | Schelhorn |
| 5,150,832 A | * | 9/1992 | Degani et al. |
| 5,211,764 A | * | 5/1993 | Degani |
| 5,296,649 A | * | 3/1994 | Kosuga et al. |
| 5,346,775 A | * | 9/1994 | Jin et al. |
| 5,385,290 A | * | 1/1995 | Degani |

FOREIGN PATENT DOCUMENTS

| EP | 000651600 A1 * | 5/1995 |
| JP | 2310991 | 12/1990 |

OTHER PUBLICATIONS

W.A. Zisman, "Contact Angle, Wettability, and Adhesion", Advances in Chemistry Series 43, American Chemical Society (1964), LCCC 63–14481, pp. 1–51.

P. G. de Gennes, "Wetting: statics and dynamics", Rev. Mod. Phys. 57, (1985), pp. 827–865.

\* cited by examiner

Primary Examiner—M. Alexandra Elve
Assistant Examiner—Kiley Stoner
(74) Attorney, Agent, or Firm—Ernestine C. Bartlett

(57) ABSTRACT

A method of solder-coating a metallic pad provided on a substrate, whereby at least the surface of the pad is provided with a deposit of solder paste, which paste comprises a suspension of metallic solder particles which, when molten, have a surface energy lower than the critical surface energy of the metallic pad but higher than the critical surface energy of the substrate surface outside the borders of the pad, whereby application of heat causes metallic solder particles within the paste lying upon the pad to melt and fuse together into an essentially continuous metallic solder layer, whereas the metallic solder particles within any paste lying upon the substrate surface outside the borders of the pad do not thus fuse together into a layer but are instead deposited as mutually-isolated solder beads, which beads can be subsequently removed from the substrate surface after completion of the heating process.

13 Claims, 6 Drawing Sheets

SOLDER-COATING METHOD, AND SOLDER PASTE SUITABLE FOR USE THEREIN

This application is a division of Ser. No. 08/331,823 filed Oct. 31, 1994, now U.S. Pat. No. 5,551,628.

The invention relates to a method of solder-coating a metallic pad provided on a substrate, whereby at least the surface of the pad is provided with a deposit of solder paste, after which the substrate is at least partially subjected to a heating process, which heating process induces localised precipitation of an essentially continuous metallic solder layer out of the solder paste, which localised precipitation occurs on the pad but not upon the substrate surface outside the borders of the pad, subsequent to which any unwanted solder paste debris upon the substrate surface outside the borders of the pad is removed.

The invention also relates to a solder paste suitable for use in a method of this type.

Solder-coated metallic pads as hereabove referred to can be used as fixation-bases for the legs of electrical components. Commonly used printed circuit boards (and flexible printed circuit foils) comprise a substrate which is provided with a plurality of metallic pads arranged according to definite patterns and selectively interconnected via a network of conducting tracks. When the pads of such a circuit board have been solder-coated in the above-described manner, appropriate electrical components can be fixed to the board using a so-called "reflow" soldering process. This process entails placement of the components at predetermined locations on the board, arrangement of their legs on the intended solder-coated metallic pads, and subsequent application of heat. The solder layer between each leg and the corresponding pad then melts, whereby the leg is soldered to the pad upon subsequent cooling. Further information on reflow soldering is given by C. Lea in "A Scientific Guide to Surface Mount Technology", Electrochemical Publications Limited (1988), ISBN 0 901150 22 3, in particular Chapter 7.

Modern printed circuit boards (and foils) are often highly complex, and frequently involve a very large packing-density of components. This means that the metallic pads on such a board will often be present in very large numbers, and in very close proximity to one another. In this respect, it is advantageous that the selective solder-coating method as hereabove described can efficiently coat all the pads (and none of the substrate) in one go. This eliminates the need to provide solder on a tedious and meticulous pad-by-pad basis.

A solder-coating method as described in the opening paragraph, together with a solder paste for use therein, are elucidated in un-examined Japanese Patent Disclosure (Kokai) JP-A-2-310991 (Fukunaga et al.). According to this state-of-the-art document, a solder paste comprising a mixture of Sn powder and organic acid Pb salts is painted onto the metallic pads of a printed circuit board, without the need to confine the paste exclusively to the pads. The pasted circuit board is then exposed for several minutes to a temperature of about 220° C., whereby a localised chemical reaction occurs between the said Sn powder and Pb salts, with consequent precipitation of SnPb alloy out of the paste. This reaction and the said attendant precipitation occur only on the metallic surfaces of the pads, and not on the naked non-metallic substrate surface outside the borders of the pads.

Since the SnPb alloy precipitated on the pads in this manner is rather Sn-rich, a second process step is enacted, whereby a seed oil flax containing Pb ions is brought into contact with the alloy-coated pads, and subsequently heated. This induces a chemical reaction which enriches the Pb-content of the existing SnPb alloy, at the expense of its Sn-content. The final solder alloy composition should then have the desired ratio of Sn to Pb.

Appraisal tests conducted by the present inventors have shown this known method to have certain disadvantages, some of which can be summarised as follows:

(1) The employed organic acid Pb salts, such as lead naphthenate, are particularly toxic. Special precautions are therefore required to protect the health of process operators;
(2) Due to the relatively high temperatures and lengthy thermal exposure involved, the required heating process can result in serious discolouration of the printed circuit board, unless heating is conducted in a chemically inert atmosphere;
(3) Solder-coverage of the metallic pads can prove unsatisfactory unless the printed circuit board is etch-cleaned before painting it with solder paste. This adds a further step to the total coating process;
(4) The risk of unwanted short circuits caused by solder blobs on the metallic pads increases to unacceptable levels when the mutual separation of the metallic pads is 200 $\mu$m or less. In view of the modern trend in the electronics industry towards the use of multi-legged surface-mounted components with ever decreasing leg-pitches, such unacceptable solder-coverage places a lower limit on the leg-separations of components intended for use on solder-coated printed circuit boards produced by the known method.

It is an object of the invention to provide a solder-coating method as elucidated in the opening paragraph, without reliance on the use of highly toxic organic acid Pb salts. It is a further object of the invention that such a method should employ thermal processing conditions which are mild enough to impede serious substrate discolouration. Moreover, the invention aims at the satisfactory application of such a method at mutual pad separations smaller than 200 $\mu$m, and without the necessity of etch-cleaning pads prior to solder-coating them.

These and other objects are achieved in a method as described in the opening paragraph, characterised in that a solder paste is used which comprises a suspension of metallic solder particles which, when molten, have a surface energy lower than the critical surface energy of the metallic pad but higher than the critical surface energy of the substrate surface outside the borders of the pad, that the heating process causes the metallic solder particles within the paste lying upon the pad to melt and fuse together into an essentially continuous metallic solder layer, and that the metallic solder particles within any paste lying upon the substrate surface outside the borders of the pad do not fuse together into a layer but are instead deposited as mutually-isolated solder beads, which beads can be subsequently removed from the substrate surface after completion of the heating process.

In such a method, the metallic solder particles contained in the employed solder paste already have the chemical composition which is desired of the final solder coating. Once these particles have been deposited as a layer, therefore, such a layer win require no further enriching or other compositional modification. In contrast to the known method, there is thus no need to derive a Pb-content from toxic organic acid Pb salts, or from a separately-applied flax containing Pb ions.

In the inventive method, the mechanism by which a solder coating is caused to precipitate out of the solder paste is mediated by physical processes rather than chemical reactions. On the one hand, melted solder particles in the paste located on the metallic pad can successfully "wet" the pad's surface by amalgamating together into a thin film. This effect is attributable to the fact that the surface energy (surface tension) of the solder particles is lower than that of the pad, so that such "wetting" is energetically favourable. On the other hand, melted solder particles in any paste deposits located on the naked substrate surface outside the borders of the pad will not amalgamate together and "wet" the substrate surface, but will instead lie on it in the form of small mutually-isolated solder beads. This is due to the fact that the surface energy of the solder particles exceeds that of the naked substrate surface, so that "wetting" of such a surface by the particles is energetically unfavourable. For the purpose of further clarification and illustration only, such surface energy effects can be likened to those exhibited by rainwater deposited on the surface of a partially waxed automobile. Whereas such water can tend to form extended films on those surfaces of the vehicle which have not been waxed, it is forced to form a myriad of small beads in any areas which have been waxed. A detailed discussion of surface energy in relation to "wetting" of surfaces is given by P. G. de Gennes in Rev. Mod. Phys. 57 (1985), pages 827–865. Additional information is given by W. A. Zisman in "Contact Angle, Wettability, and Adhesion", Advances in Chemistry Series 43, American Chemical Society (1964), LCCC 63-14481, pages 1–51.

In the known method, the temperature to which the solder paste is heated in order to cause precipitation of SnPb alloy (the so-called "processing temperature") is dictated by the activation temperature of the desired chemical reaction between the Sn powder and the organic acid Pb salt (typically about 220° C.). In addition, the required minimum duration of such thermal exposure depends on the rate of the said reaction, and has a typical value of about 2–4 minutes. On the other hand, the minimum processing temperature in the inventive method is determined by the melting point of the metallic solder particles in the employed solder paste, which can be considerably lower than the activation temperature of 220° C. quoted above. Moreover, the duration of this thermal processing can be considerably shorter than in the known method, since there is no chemical reaction involved. Thanks to these two factors, the substrate discolouration observed in the known method can be very substantially avoided using the inventive method.

Numerous and extensive tests of the inventive method's reliability and effectiveness have been performed, as elucidated more particularly in the exemplary embodiments herebelow. All such tests revealed excellent solder-coverage of the metallic pads concerned, without the necessity to first subject such pads to an etch-cleaning process. Highly satisfactory solder-coverage at mutual pad separations of less than 200 $\mu$m was also observed in such tests.

The concentration of metallic solder particles within the solder paste is an important parameter in the inventive method. It should be observed that, for relatively high values of this concentration, the solder beads deposited on the naked substrate surface may occur thereupon in such close proximity to one another as to make mutual physical contact, with the attendant risk of formation of electrically conducting tracts (and possibility of a short circuit). On the other hand, if the concentration of metallic solder particles within the solder paste is relatively low, then adequate surface "wetting" of the metallic pad will be hindered, leading to deficient solder-coverage of the pad.

The average diameter of the metallic solder particles in the solder paste plays a similar role in such considerations. If these particles are relatively small, then the metallic solder layer deposited on the metallic pads may not be continuous, but may demonstrate open patches or areas of unacceptably thin solder-coverage. On the other hand, if the particles are relatively large, then localised "clumping together" of particles may occur, with the possible formation of an unwanted electrically conductive tract between two pads, resulting in a short circuit.

In view of these considerations, the applicant has developed a new solder paste which can be advantageously employed in the method according to the present invention, resulting thereby in very satisfactory solder-coating of the metallic pad. The current invention also relates to such novel solder paste, which is characterised in that it comprises a suspension of metallic solder particles whose concentration in the solder paste lies in the range 5–11 vol. % at STP, and whose average diameter lies in the range 10–40 $\mu$m. "STP" stands here for "Standard Temperature and Pressure", defined as a temperature of 26° C. (room temperature) and a pressure of 1 atmosphere. This solder paste has a relatively low toxicity (no organic acid Pb salts) and a relatively simple constitution (metallic solder particles already present, rather than arising out of chemical reactions within the paste).

A preferred embodiment of the inventive solder paste is characterised in that the quantity of metallic solder particles in the solder paste lies in the range 7–9 vol. % at STP, and that the average diameter of the said particles lies in the range 20–30 $\mu$m.

A particularly suitable embodiment of the solder paste according to the invention is characterised in that the metallic solder particles are comprised of an alloy of Sn and Pb. Among other advantages, the melting points of SnPb alloys are relatively low, thereby allowing use of a correspondingly low processing temperature in the inventive method. A suitable example of such an alloy contains 60–65 wt. % Sn and 35–40 wt. % Pb, and has a melting point of about 180–190° C.

A preferential embodiment of the inventive solder paste is characterised in that it comprises a flux solution. Flux solutions are conventional in the art, as discussed in detail by R. J. Klein Wassink in "Soldering in Electronics", 2nd Edition, Electrochemical Publications Limited (1989), ISBN 0 901150 24 X, in particular Chapter 5. A typical flux solution may comprise, for example, a mixture of a colofonium resin, a thickening agent and a solvent. The inclusion of a flux solution in the solder paste improves the ability of the metallic solder particles to "wet" the surface of the metallic pad. Depending on the type of metallic solder particles present in the inventive solder paste, the flux solution may typically constitute 40–60 wt. % of the paste.

A further embodiment of the solder paste according to the invention is characterised in that it comprises an activator mixture. Activator mixtures are also conventional in the art, as discussed in the above-cited book by Klein Wassink, Chapter 5, Section 5.5.3. A typical activator mixture may comprise, for example, an activator, a moistening agent, a thickening agent, a colofonium resin and various solvents. The presence of such an activator helps to remove possible oxides from the metallic pad and from the metallic solder particles in the solder paste, and it improves the action of any flux solution present in the paste. Depending once again on the type of metallic solder particles present in the inventive solder paste, the employed activator mixture may typically constitute 5–25 wt. % of the paste. Although SnPb alloys are particularly suitable for use in the solder paste according to the invention, they are by no means the only metallic solder materials which lend themselves to such use. Other exemplary metallic solder materials of a suitable nature include Au, various alloys such as SnAg, SnCu, SnBi and SnNi (for assorted relative concentrations of the alloy components), and mixtures hereof.

Suitable substrate materials for use with the inventive method include, for example, electrically insulating polymeric materials (resins and plastics) and composite materials comprising polymers reinforced with inorganic substances (e.g. epoxy resin reinforced with glass particles or fibers). Specific examples of such materials include FR2 phenolic paper and FR4 glass epoxy, both of which are flame retardant (FR). Alternatively, it is possible to use an electrically conducting substrate base which is at least partially provided with a layer of insulating material, with subsequent provision of metallic pads on top of this insulating layer. Suitable pad materials include, for example, Cu, Cu-containing alloys, AgPd, and mixtures hereof.

It is of course possible to employ the inventive method to solder-coat only pre-selected metallic pads on a given substrate, if so desired, by ensuring that pads other than the selected pads do not receive a deposit of solder paste prior to heating. So as to minimise waste, the inventive method also allows the solder paste to be applied using a stencil or printing screen, thus avoiding unnecessary application of solder paste to large open areas of naked substrate (or to pads which are not intended to be solder-coated).

Although the minimum required processing temperature in the method according to the invention is largely determined by the melting point of the metallic solder particles in the employed solder paste, it is of course possible to use processing temperatures higher than that melting point. Use of such elevated temperatures has the advantage that it results in decreased viscosity of the liquified metallic solder, thus improving the solder's ability to "wet" the metallic pad. When used as a supplement to thermal processing at lower temperatures, any thermal processing at such elevated temperatures need only be of a relatively short duration (a few seconds), and such short exposure of the substrate to temperatures well above the solder's melting point need not lead to substantial substrate discolouration. For example, in tests of the inventive method using an FR4 glass epoxy substrate with Cu pads and making use of a solder paste (according to the invention) comprising an SnPb alloy with a melting point of 183° C., the inventors satisfactorily applied a (supplementary) processing temperature of 250° C. for a duration of 10 seconds, without causing serious substrate discolouration. Using the method known from the state of the art, however, the same substrate material showed extensive discolouration after exposure to a temperature of only 220° C., because of the longer thermal processing time which the known method required (4 minutes).

In the method according to the invention, the mutually-isolated solder beads which remain on the naked substrate surface after completion of the heating process can be removed by, for example, subjecting the substrate to a washing process. Suitable washing materials for this purpose include, for example, aqueous solutions of detergent. If so desired, the washing process may be accompanied by mild brushing or sponging of the substrate. The solder-coating on the metallic pads will not be adversely influenced by such a washing process. Washing of solder-coated printed circuit boards in general is discussed in more detail in the above-cited book by Klein Wassink, Chapter 5, Section 5.7.

Because of the relatively low concentration of metallic solder particles in the inventive solder paste, this paste can have a rather low viscosity. If the paste is applied using a stencil or printing screen in combination with a squeegee, such low viscosity can result in relatively easy "scooping" of paste out the openings in the stencil or printing screen, with attendant unsatisfactory paste-coverage of the metallic pads. The extent of such scooping can be reduced by carefully choosing the thickness of the. stencil or printing screen, and by using a relatively hard squeegee. In addition, if necessary, the openings in the stencil can be interrupted at intervals by diagonal "dams" which subdivide each main opening into constituent smaller openings. Solder paste is not so easily "scooped" out of such smaller openings, and the width of the diagonal "dams" is small enough to ensure that solder paste is still very well distributed over a majority area of each pad.

The heating process inherent in the method according to the invention can be enacted in many different ways. For example, the substrate (with pasted pads) can be partially or wholly subjected to thermal radiation from a heater element, or it can be partially or wholly exposed to a heated gas or vapour. Alternatively, a laser beam can be employed to selectively heat, for example, only the pasted pads and their immediate vicinity. Such heating methods can also be used for reflow-soldering electrical components to their corresponding solder-coated pads. The temperature, duration and profile of these heating processes can be matched to the particular properties of the employed solder paste.

BRIEF DESCRIPTION OF THE DRAWINGS

The invention and its attendant advantages will be further elucidated with the aid of exemplary embodiments and the accompanying schematic drawings, not of uniform scale, whereby.

EMBODIMENT 1

Figure 1:
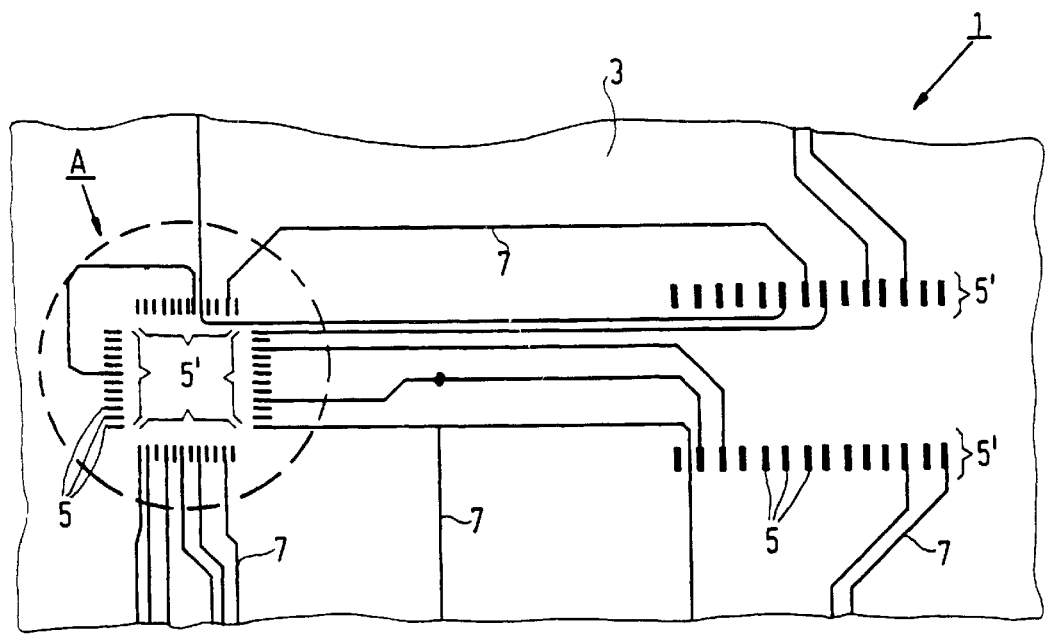
FIG. 1 depicts a plan view of part of a printed circuit board which is to be partially solder-coated using the method according to the invention.

FIG. 1 shows a printed circuit board 1 which is to be partially solder-coated using the method according to the present invention, various phases of this method being depicted in ensuing FIGS. 2–5. FIG. 6 illustrates the subsequent fixation of a suitable electrical component to the solder-coated metallic pads of such a circuit board. Identical parts in the various Figures are denoted by the same reference symbols.

FIG. 1 shows a flame-retardant FR4 glass epoxy substrate 3 which has been provided with a plurality of Cu pads 5 on one of its surfaces. These pads 5 are arranged in definite patterns corresponding to the leg-arrangements of given electrical components, and are selectively inter-connected via Cu tracks 7. The pads 5 vary in size, being typically about 1–2 mm long and about 50–200 μm wide. Because the pads 5 depicted here are intended to correspond to the leg-arrangements of integrated circuit components (such as microprocessor chips, memory chips, etc.), they are arranged in definite longitudinal arrays 5'. The pitch of the pads 5 in each array 5' (i.e. the minimum centre-to-centre distance) lies in the range 300–600 μm.

The pads 5 and tracks 7 are provided on the substrate 3 using a well-known technique. For example, the relevant surface of the substrate 3 can be provided with a thin and continuous layer of Cu, upon which layer the various desired patterns and networks of the pads 5 and tracks 7 are then marked with etch-resistant ink, subsequent to which the Cu layer is subjected to etching and consequent removal of those parts of the Cu layer located outside the various etch-resistant markings, which markings are finally removed by cleaning so as to expose bare metallic pads and tracks.

Figure 2:
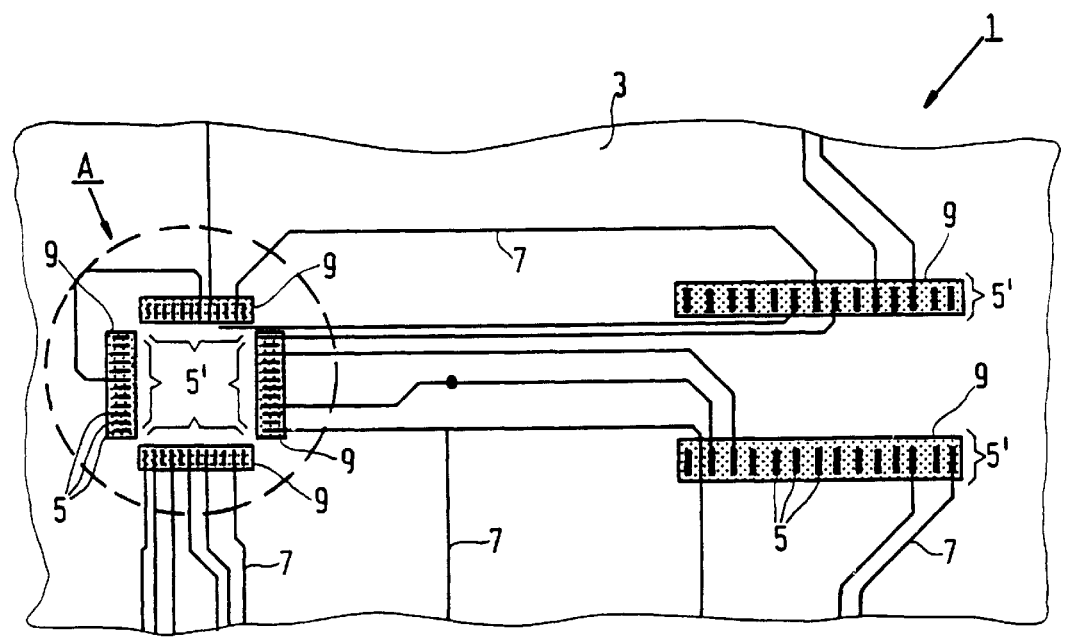
FIG. 2 shows the printed circuit board rendered in FIG. 1, after enaction of a first process step according to the inventive method.

In FIG. 2, the metallic pads 5 have been provided with deposits 9 of solder paste according to the invention. These deposits 9 overlap the pads 5, thereby partially sitting on the naked substrate surface outside the borders of the pads.

The particular solder paste used in this case comprised about 7.5 vol. % SnPb powdered alloy together with a flux solution and an activator mixture. The average diameter of the metallic solder particles was about 25 μm. The SnPb alloy itself comprised approximately 63 wt. % Sn and 37 wt. % Pb. The paste was made by mixing together 48 g of a flux solution and 12 g of an activator mixture (both known from the above-cited book by Klein Wassink), with addition of 40 g of the said solder powder.

So as to reduce waste, the solder paste deposits 9 were applied to the arrays 5' using a stencil and metal squeegee, thereby confining the deposits 9 to the proximity of the arrays 5'. The employed stencil was 50 μm thick, and the rectangular dimensions of each of its openings exceeded the outline rectangular dimensions of each corresponding array 5' by about 0.2 μm along all four edges. Other possible means by which the paste deposits 9 could have been provided include, for example, brushing, daubing or pouring. It would, of course, also have been possible to provide the entire board 1 (or a large part thereof) with a "global" deposit of solder paste, e.g. by dipping.

Figure 3:
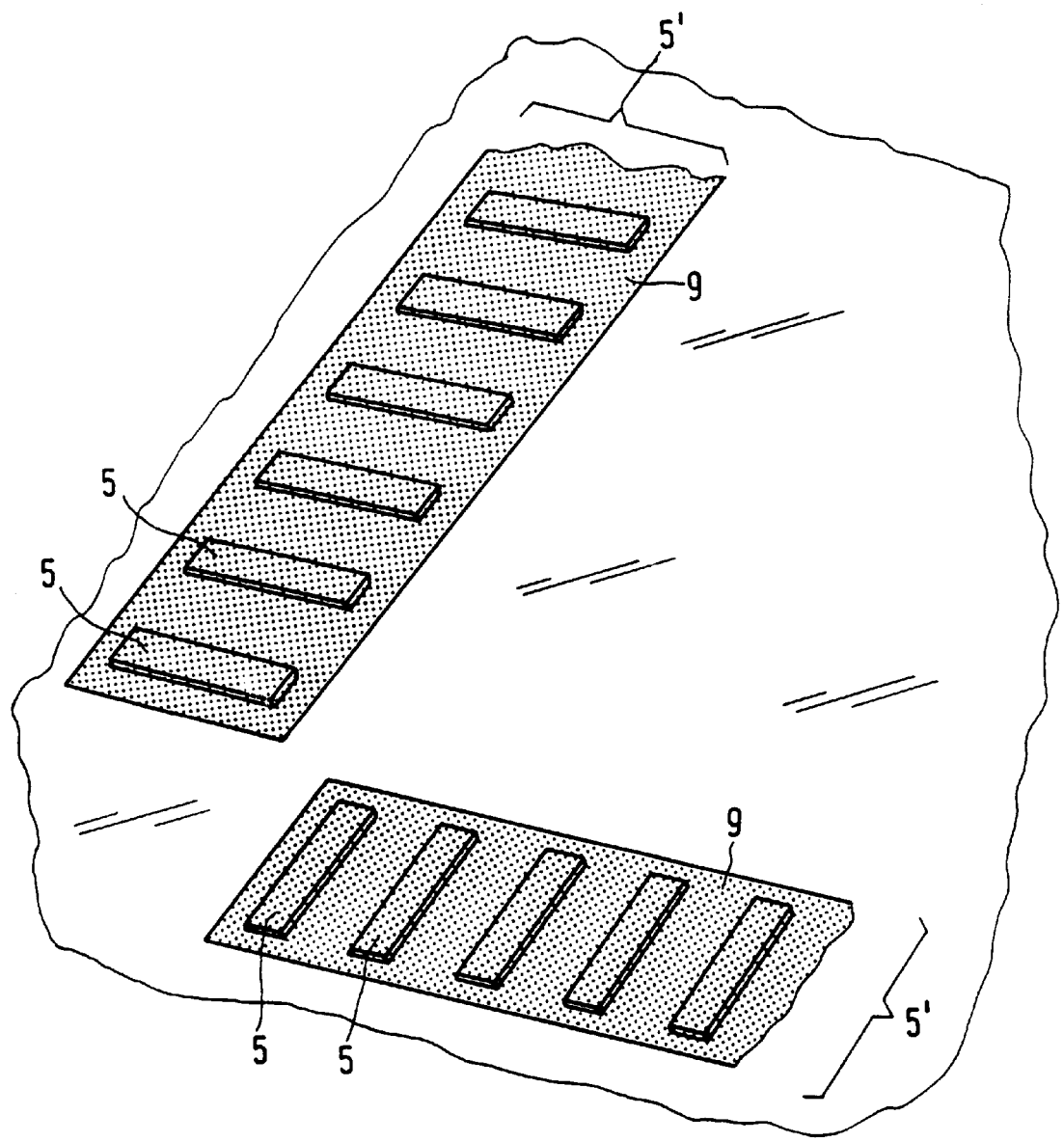
FIGS. 3, 4 and 5 render a perspective view of a particular section of the printed circuit board shown in FIGS. 1 and 2, during various phases of the inventive solder-coating process.
Figure 4:
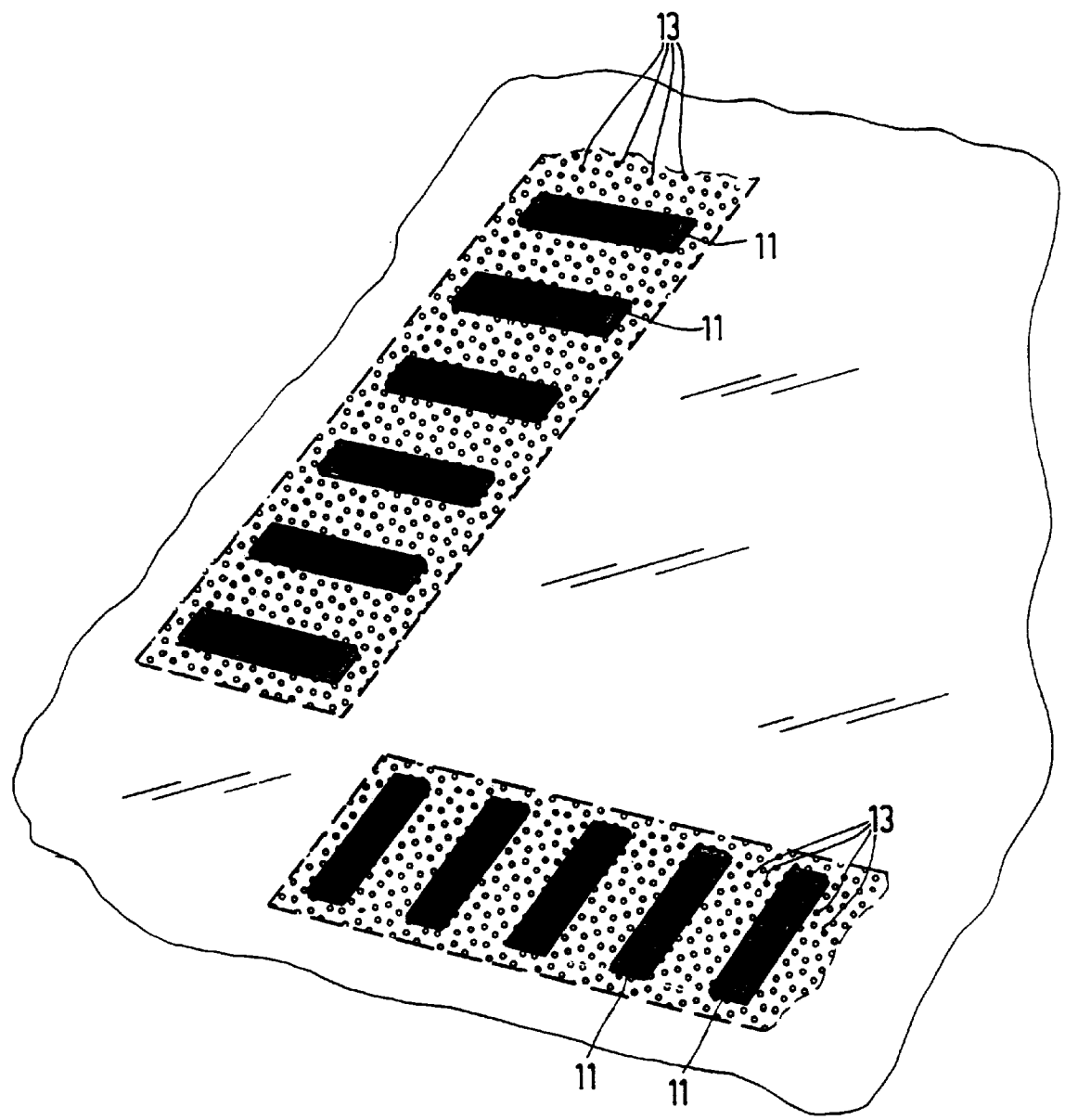
Figure 5:
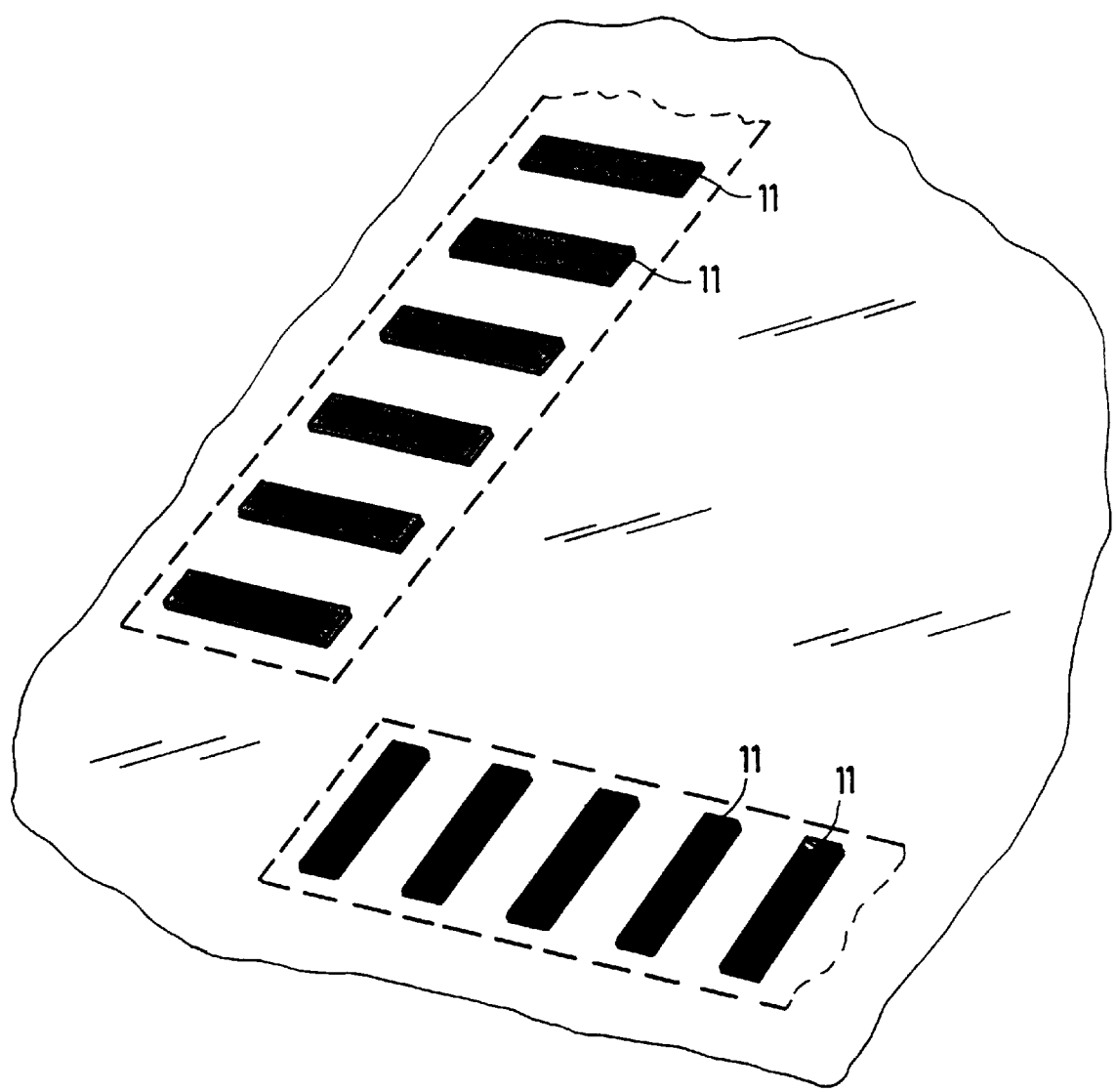
Figure 6:
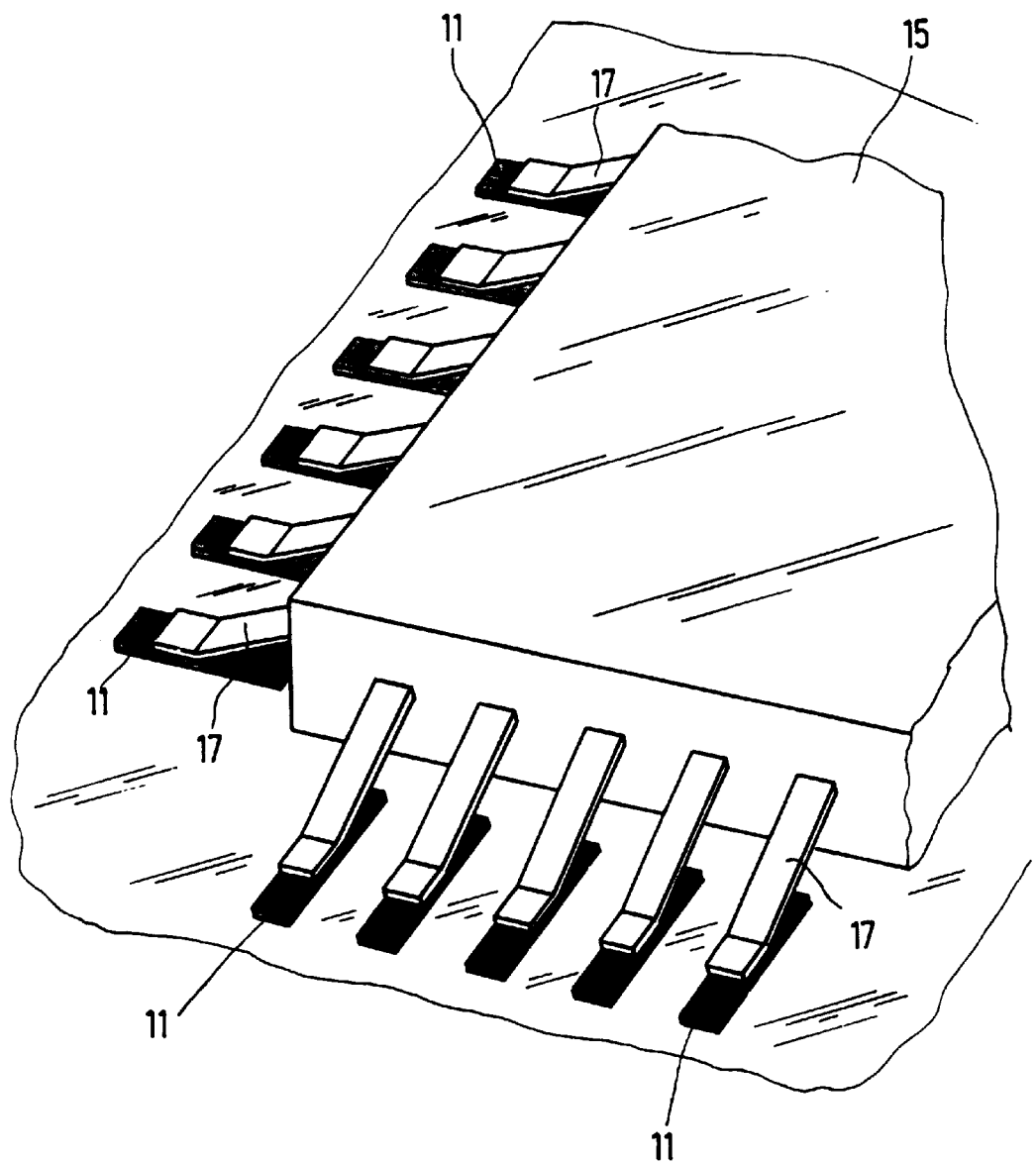
FIG. 6 depicts the placement of a multi-legged electrical component on the array of solder-coated metallic pads shown in FIG. 5.

Part of region "A" in FIGS. 1 and 2 is depicted in greater detail in FIGS. 3–5, which render a schematic view of two arrays 5' of metallic pads 5.

FIG. 3 shows two arrays 5' of metallic pads 5 which are covered and locally surrounded by two deposits 9 of solder paste. After provision of the deposits 9, the board 1 was subjected to heating by exposing it to infra-red radiation in a reflow oven. The thermal processing procedure consecutively comprised:

(a) 100 seconds exposure to a temperature of 130° C.;
(b) 15 seconds exposure to a temperature of 210° C.;
(c) Cooling to room temperature.

These process steps did not cause noticeable discolouration of the substrate 3.

FIG. 4 illustrates the result of the thermal processing. On the metallic surfaces of each pad 5, an essentially continuous and uniform layer 11 of metallic solder (here represented by fine shading) has precipitated out of the deposited solder paste. However, any solder paste deposited on the naked substrate surface outside the borders of the pads 5 has left behind a myriad of small metallic solder beads 13, of approximate individual diameter 25 μm.

These solder beads 13 were removed from the surface of the substrate 3 by washing with a solvent. FIG. 5 shows the vicinity of the metallic pads 5 after such removal of the beads 13, whereby each pad 5 has retained its coating 11 of metallic solder.

In FIG. 6, a multi-legged electrical component 15 has been thus positioned that its legs 17 are neatly seated on the arrays 5' of metallic pads 5. By applying heat, the solder layer 11 on each pad 5 can be caused to melt. Upon subsequent cooling, each layer 11 will re-solidify, thereby soldering each leg 17 to a corresponding metallic pad 5. This reflow soldering process is well known in the art, and need not be further specified here.

EMBODIMENT 2

Figure 7:
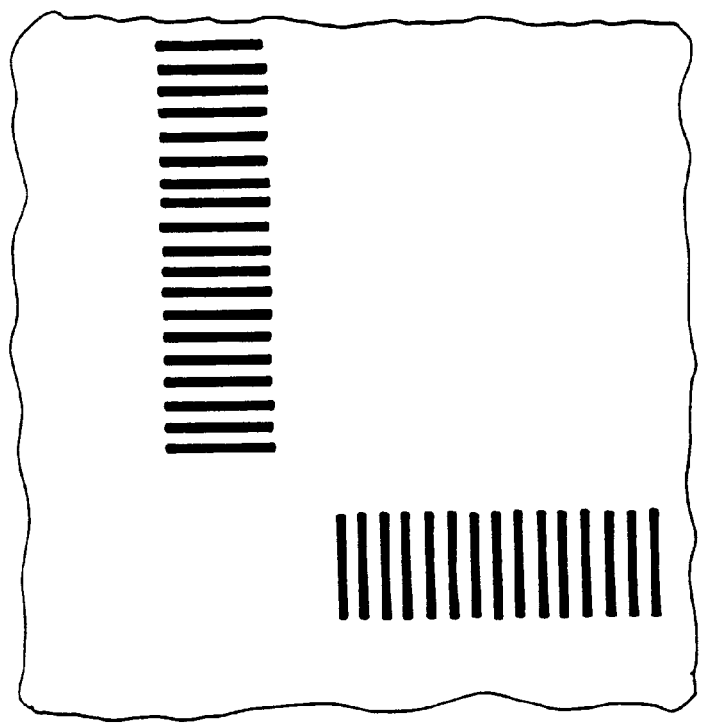
FIGS. 7 and 8 show plan views of two arrays of fine-pitch metallic pads, which in one case have been solder-coated using the method and solder paste according to the present invention (FIG. 7), and in the other case have been solder-coated using the method and solder paste already known from the state of the art (FIG. 8).
Figure 8:
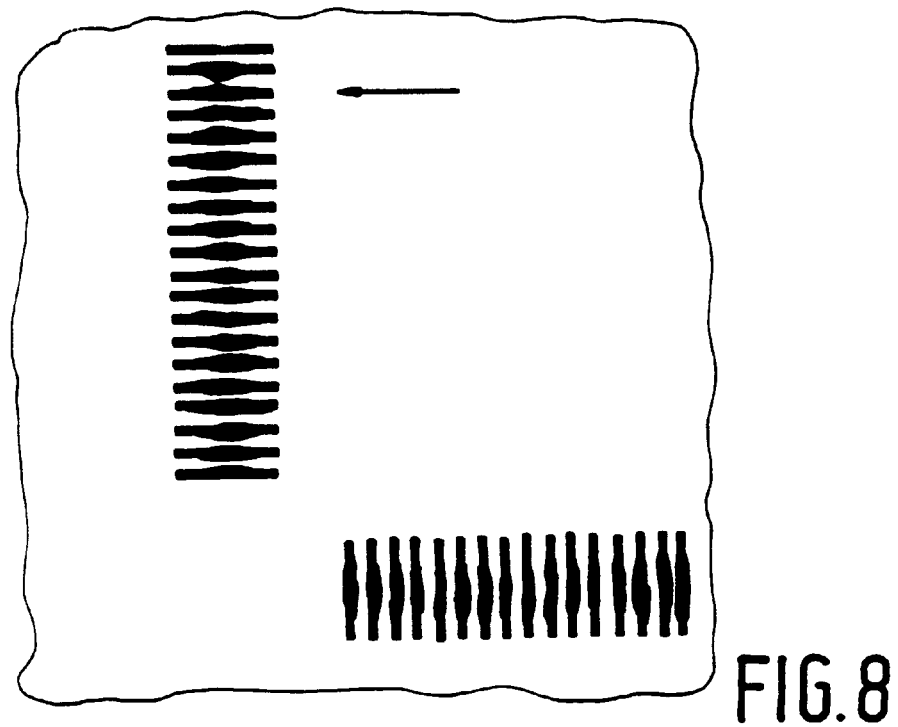

FIGS. 7 and 8 give a plan view of a double array of metallic pads located on the surface of a printed circuit board. The pitch of the pads is 200 μm, and the mutual separation of consecutive pads is about 100 μm (both values being considerably smaller than those occurring in Embodiment 1). The arrays correspond to the leg configurations of a microprocessor device which is to be surface-mounted on the pads using a reflow soldering method. Both Figures are accurate sketches of photographs taken by the present inventors.

In FIG. 7, the metallic pads have been solder-coated using the method according to the present invention. The employed substrate material, pad material, solder paste composition, paste application method, heating procedure and subsequent washing procedure were identical to those elucidated in Embodiment 1 above.

The photograph shows the solder-coating on each pad to be flat, continuous and uniform. There are no short circuits, and no undesirable solder blobs on the pads.

EMBODIMENT 3 (NOT ACCORDING TO THE INVENTION)

In FIG. 8, the depicted metallic pads have been solder-coated using the method and solder paste known from the above-cited state-of-the-art document (Fukunaga et al.). The substrate material and pad material were identical to those used in Embodiment 2.

The pads were etched clean (for 60 seconds) prior to application of the solder paste, which comprised 45 wt. % lead naphthenate, 10 wt. % tin powder, 25 wt. % Foral AX (a colofonium resin), 7 wt. % dilatant, and 5 wt. % Yarmor 302 (oil). The average diameter of the tin particles was about 35 μm. The paste was applied to the arrays using a printing screen, the thickness of the applied paste layer being about 200 μm. The subsequent processing temperature was 215° C., which was maintained for 200 seconds.

The presence of relatively large solder blobs on many of the pads is clearly visible. At pitches smaller than 200 μm, such blobs can cause short circuits by physically touching against each other, thereby undesirably connecting two pads together. Indeed, in this respect, the blobs indicated by an arrow in FIG. 8 are already dangerously close together at the present pitch.

What is claimed is:

1. A solder paste particularly adapted for use in a method of solder coating a metallic pad provided on a surface of a substrate, whereby at least a surface of the pad is provided with a deposit of solder paste, after which the substrate is at least partially subjected to a heating process, which heating process induces localized precipitation of an essentially continuous metallic solder layer out of the solder paste, said localized precipitation occurring on the pad but not on said surface of the substrate outside borders of the pad, subsequent to which any unwanted solder paste debris on the substrate outside borders of the pad is removed, characterized in that the solder paste comprises a suspension of metallic solder particles the concentration of which metallic solder particles in the paste being about 5–11 vol. % at STP, which metallic solder particles having an average diameter of about 20–30 μm and which metallic solder particles, when molten, have a surface energy lower than the critical surface energy of the metallic pad but higher than the critical surface energy of said surface of the substrate outside borders of the pad and which metallic solder particles within the paste lying on the pad, when heated, fusing together into an essentially continuous solder layer and which metallic solder particles outside borders of the pad, when heated, forming mutually-isolated solder beads removable subsequent to heating.

2. A solder paste according to claim 1, characterised in that the quantity of metallic solder particles in the solder paste lies in the range 7–9 vol. % at STP, and that the average diameter of the said particles lies in the range 20–30 μm.

3. A solder paste according to claim 2, characterized in that the metallic solder particles are comprised of an alloy of Sn and Pb.

4. A solder paste according to claim 2, characterized in that the solder paste comprises a flux solution.

5. A solder paste according to claim 2, characterized in a that the solder paste comprises an activator mixture.

6. A solder paste according to claim 1, charaterised in that the metallic solder particles are comprise of an alloy of Sn and Pb.

7. A solder paste according to claim 6, characterized in that the solder paste comprises a flux solution.

8. A solder paste according to claim 6, characterized in a that the solder paste comprises an activator mixture.

9. A solder paste according to claim 1, characterised in that the solder paste comprises a flux solution.

10. A solder paste according to claim 7, characterized in a that the solder paste comprises an activator mixture.

11. A solder paste according to claim 1, characterised in that the solder paste comprises an activator mixture.

12. A printed circuit board or foil comprising plurality of metallic pads provided on an insulating substrate characterized in that at least one pad of said pads is solder coated by applying to a surface of said at least one pad a deposit of a solder paste comprising a suspension of metallic solder particles in a concentration in the solder paste of about 5–11 vol. % at STP, which metallic solder particles have an average diameter of about 20–30 μm and which metallic particles, when molten, have a surface energy lower than the critical surface energy of said at least one pad but higher than the critical surface energy of said surface outside the borders of said at least one pad, subjecting said substrate, at least partially, to a heating process to thereby induce localized precipitation of an essentially continuous metallic solder layer on said at least one pad but not on said substrate outside of borders of said at least one pad, subsequent to which any unwanted solder paste debris upon the substrate outside borders of said at least one pad is removed.

13. A printed circuit board or foil as claimed in claim 12, wherein at least a second pad is solder-coated by the method used to coat said at least one pad and the mutual separation of said at least one pad at said at least second pad is less than 200 μm.

* * * * *